(12) United States Patent
Martin et al.

(10) Patent No.: US 9,088,850 B2
(45) Date of Patent: Jul. 21, 2015

(54) MICROMACHINED HORN

(75) Inventors: David Martin, Fort Collins, CO (US);
Joel Philliber, Fort Collins, CO (US);
John Choy, Westminster, CO (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 24 days.

(21) Appl. No.: 13/536,917

(22) Filed: Jun. 28, 2012

(65) Prior Publication Data
US 2012/0269372 A1 Oct. 25, 2012

Related U.S. Application Data

(62) Division of application No. 12/434,092, filed on May 1, 2009, now Pat. No. 8,231,795.

(51) Int. Cl.
*H04R 1/30* (2006.01)
*H01L 27/20* (2006.01)
*H04R 17/00* (2006.01)

(52) U.S. Cl.
CPC . *H04R 1/30* (2013.01); *H01L 27/20* (2013.01); *H04R 17/005* (2013.01); *H04R 2201/003* (2013.01); *Y10T 29/42* (2015.01)

(58) Field of Classification Search
CPC ....... H01L 41/332; H01L 31/00; H01L 33/00; H01L 29/00; H01L 29/02
USPC .............. 381/340, 339; 216/2, 18, 61, 86, 72; 438/734, 701, 706, 100; 29/25, 2.35
See application file for complete search history.

(56) References Cited

U.S. PATENT DOCUMENTS

| | | | |
|---|---|---|---|
| 3,962,544 A * | 6/1976 | Kobayashi | 381/342 |
| 4,320,365 A | 3/1982 | Black et al. | |
| 5,488,954 A * | 2/1996 | Sleva et al. | 600/459 |
| 5,501,893 A | 3/1996 | Laermer et al. | |
| 5,526,456 A * | 6/1996 | Heinz | 381/340 |
| 5,728,089 A | 3/1998 | Lal et al. | |
| 6,034,409 A * | 3/2000 | Sakai et al. | 257/506 |
| 6,244,738 B1 | 6/2001 | Yasuda et al. | |
| 6,349,454 B1 * | 2/2002 | Manfra et al. | 29/25.35 |
| 6,475,920 B2 * | 11/2002 | Coburn et al. | 438/714 |
| 6,534,247 B2 | 3/2003 | Milligan et al. | |
| 6,750,116 B1 * | 6/2004 | Chen | 438/434 |
| 6,818,564 B1 | 11/2004 | Gormley | |
| 6,934,455 B2 * | 8/2005 | Skinner et al. | 385/129 |

(Continued)

FOREIGN PATENT DOCUMENTS

JP     05275399 A  * 10/1993  ........... H01L 21/302
JP     07-245796 A1    9/1995

OTHER PUBLICATIONS

Bayer et al, Method of Producing Submicron Apertures with (Variable) Angles, Jun. 1992, IBM Technical Disclosure Bulletin, vol. 35 No. 1A (p. 263-264).*

(Continued)

*Primary Examiner* — Davetta W Goins
*Assistant Examiner* — Oyesola C Ojo

(57) ABSTRACT

An acoustic device includes a transducer formed on a first surface of a substrate and an acoustic horn formed in the substrate by a dry-etching process through an opposing second surface of the substrate. The acoustic horn is positioned to amplify sound waves from the transducer and defines a non-linear cross-sectional profile.

18 Claims, 6 Drawing Sheets

(56) References Cited

U.S. PATENT DOCUMENTS

| | | |
|---|---|---|
| 6,940,367 B2 | 9/2005 | Ma et al. |
| 6,958,255 B2 * | 10/2005 | Khuri-Yakub et al. ......... 438/48 |
| 7,268,647 B2 | 9/2007 | Sano et al. |
| 7,275,292 B2 | 10/2007 | Ruby et al. |
| 7,276,994 B2 | 10/2007 | Takeuchi et al. |
| 7,536,769 B2 | 5/2009 | Pedersen |
| 2002/0076070 A1 | 6/2002 | Yoshikawa et al. |
| 2004/0051757 A1 | 3/2004 | Holland |
| 2004/0178171 A1 * | 9/2004 | Nagarajan ....................... 216/13 |
| 2006/0223185 A1 | 10/2006 | Fedorov et al. |
| 2007/0180916 A1 * | 8/2007 | Tian et al. ....................... 73/649 |
| 2008/0053638 A1 | 3/2008 | Appleby et al. |
| 2011/0088234 A1 | 4/2011 | Martin et al. |

OTHER PUBLICATIONS

Paul W. May, Diamond Thin Films: a 21$^{st}$ Century Material, 2000, Phil.Trans. R. Soc. London, 358, (p. 473-495).*

Bayer et al, IBM Technical Disclosure Bulletin, Jun. 1992, vol. 35, p. 263-264.*

Paul W. May, Phil. Trans. Soc. Diamond thin films: a 21st-century material, London, 2000, p. 473, 474, 479.*

Related U.S. Appl. No. 12/430,966, Joel Philliber et al., "Microcap Acoustic Transducer Device".

D. Noreland, "Gradient-based shape optimization of an acoustic horn (A)", The Journal of the Acoustical Society of America, May 2006, vol. 119, Issue 5, p. 3216. (Abstract only).

* cited by examiner

MICROMACHINED HORN

CROSS-REFERENCE TO RELATED APPLICATIONS

This application is a divisional application of application Ser. No. 12/434,092 filed on May 1, 2009, which is hereby incorporated by reference for all purposes.

BACKGROUND

Generally, acoustic transducers convert received electrical signals to acoustic signals when operating in a transmit mode, and/or convert received acoustic signals to electrical signals when operating in a receive mode. The functional relationship between the electrical and acoustic signals of an acoustic transducer depends, in part, on the acoustic transducer's operating parameters, such as natural or resonant frequency, acoustic receive sensitivity, acoustic transmit output power and the like.

A horn is an acoustic waveguide which provides an efficient means of coupling a sound source to the environment. Generally, horns may be used to amplify acoustic waves, as indicated by incorporation of horns in various acoustic devices such as loudspeakers and musical instrument, for example, to increase their sound output. Sound (acoustic waves) enters the horn at the throat and exits the horn at the mouth. In addition, a horn may be used to modify directionality characteristics or radiation pattern of an acoustic emitter, e.g., by the location, size and shape of the horn.

By extension, acoustic horns may be used with micromachined acoustic transducers, such as such as piezoelectric ultrasonic transducers and micro micro-electro-mechanical system (MEMS) transducers. When implemented on a small scale, an acoustic horn may be etched into a silicon substrate, for example, using a wet etchant, such as potassium hydroxide (KOH), which etches silicon preferentially along various crystal planes. However, KOH is an anisotropic etching process which produces limited results with respect to horn characteristics, as shown in the schematic diagram of FIG. 1. In particular, KOH etching produces a pyramidic shaped horn 110 in a substrate 105. The horn 110 has linear cross-sections and a square mouth, opening on an outside (e.g., top) surface of the substrate 105. Notably, an angle 112 defined by the mouth of the horn 110 and the outer surface of the substrate 105 is necessarily fixed at 54.7 degrees. These limitations on size and shape of micro machined acoustic horns constrain design flexibility.

SUMMARY

In a representative embodiment, an acoustic device includes a transducer formed on a first surface of a substrate and an acoustic horn formed in the substrate by a dry-etching process through an opposing second surface of the substrate. The acoustic horn is positioned to amplify sound waves from the transducer and defines a non-linear cross-sectional profile.

In a representative embodiment, a method of fabricating an integrated acoustic device includes forming a transducer on a front side of a substrate, and dry-etching an acoustic horn through a back side of the substrate. A throat of the acoustic horn is positioned adjacent to the acoustic transducer and a cross-section of the acoustic horn has non-linear sidewalls.

In a representative embodiment, an acoustic device includes a semiconductor substrate, a piezoelectric ultrasonic transducer and an acoustic horn. The piezoelectric ultrasonic transducer is formed on a front surface of the substrate. The acoustic horn is formed through a back surface of the substrate by a deep reactive ion etching (DRIE) dry-etching process, a throat of the acoustic horn being positioned adjacent to the transducer. A cross-sectional profile of the acoustic horn includes substantially exponential sidewalls.

BRIEF DESCRIPTION OF THE DRAWINGS

The example embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

In the following detailed description, for purposes of explanation and not limitation, representative embodiments disclosing specific details are set forth in order to provide a thorough understanding of the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparatuses and methods may be omitted so as to not obscure the description of the representative embodiments. Such methods and apparatuses are clearly within the scope of the present teachings.

Furthermore, as used herein, the term "acoustic" encompasses sonic, ultrasonic, and infrasonic. For example, a transmitting acoustic transducer may transmit sonic, and/or ultrasonic, and/or infrasonic waves. Also, unless otherwise noted, when a first device is said to be connected to, or coupled to, a node, signal, or second device, this encompasses cases where one or more intervening or intermediate devices may be employed to connect or couple the first device to the node, signal, or second device. However, when a first device is said to be "directly connected" or "directly coupled" to a node, signal, or second device, then it is understood that the first device is connected or coupled to the node, signal, or second device without any intervening or intermediate devices interposed therebetween.

Figure 2:
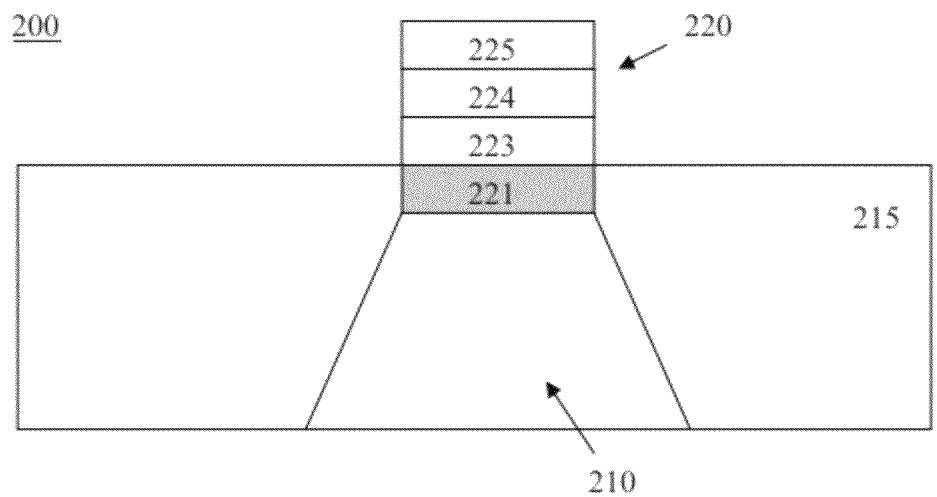
FIG. 2 is a cross-sectional diagram of an acoustic horn of an acoustic device, according to a representative embodiment.

FIG. 2 is a cross-sectional diagram of an acoustic horn for an acoustic device, according to a representative embodiment. As shown in FIG. 2, acoustic device 200 includes a micromachined acoustic horn 210 formed by a back-side dry-etching process in a substrate 215, on which an acoustic transducer 220 has been formed.

In an embodiment, the acoustic transducer 220 includes a piezoelectric thin film resonator, such as a piezoelectric MEMS ultrasonic transducer (PMUT) or a film bulk acoustic resonator (FBAR) device, for example. However, the acoustic transducer 220 in FIG. 2 (as well as the acoustic transducers depicted in FIGS. 3-7 and 9-10, below) is intended to be representative of any type of acoustic component or MEMS device, such as a capacitive or piezoresistive device, without departing from the scope of the present teachings. The acoustic transducer 220 may also represent multiple transducers, indicating that the acoustic horn 210 may formed and used in conjunction with a transducer array, in an embodiment.

In various embodiments, the acoustic transducer 220 is capable of operating in transmit and/or receive modes. When operating in the transmit mode, an excitation signal is received by the acoustic transducer 220, which outputs a corresponding acoustic signal according to a predetermined function as the transducer response, generated by mechanical vibrations induced by the received electrical excitation signal. When operating in the receive mode, an excitation signal is an acoustic signal received by the acoustic transducer 220, which outputs a corresponding electronic signal as the transducer response.

According to an embodiment, the fabrication process begins with a wafer or substrate 215, which is a semiconductor substrate, such as silicon, gallium arsenide (GaAs), a transparent substrate, such as glass, or other suitable substrate material. The acoustic transducer 220 is formed on a front or top surface of the substrate 215 using a "swimming pool" method, for example, as described in U.S. Pat. No. 7,275,292, to Ruby et al., issued Oct. 2, 2007, the contents of which are hereby incorporated by reference. That is, the front surface of the substrate 215 is initially etched to form a "swimming pool" having a size and shape of the desired transducer 220, using any wet and/or dry-etching technique. A sacrificial etch stop material, such as phosphosilicate-glass (PSG), is deposited in the etched portion to form etch stop 221. The front surface of the substrate 215 and the exposed portion of the etch stop 221 may then be polished, for example, using a chemical mechanical polish (CMP). In an alternative embodiment, the acoustic transducer 220 itself may serve as the etch stop.

The acoustic transducer 220 is then formed on the etch stop 221 using any of a variety of layering techniques. For example, a first metal layer 223 (first electrode) is formed on the etch stop 221, a piezoelectric material layer 224 is formed on the metal layer 223, and a second metal layer 225 (second electrode) is formed on the piezoelectric material layer 224. The first and second metal layers 223 and 225 may be formed of any metal compatible with semiconductor processes, such as molybdenum, tungsten or aluminum, for example. The piezoelectric material layer 224 may be formed of a material such as aluminum nitride, lead zirconate titanate (PZT), for example, or other film compatible with semiconductor processes. In various embodiments, the first metal layer 223, the piezoelectric material layer 224 and the second metal layer 225 are sequentially formed on the front surface of the substrate 210, and then etched using an etch mask to provide the acoustic transducer 220 of a desired size and shape, positioned over the etch stop 221, as shown in FIG. 2. However, other layering and shaping techniques may be incorporated without departing from the scope of the present teachings.

Figure 1:
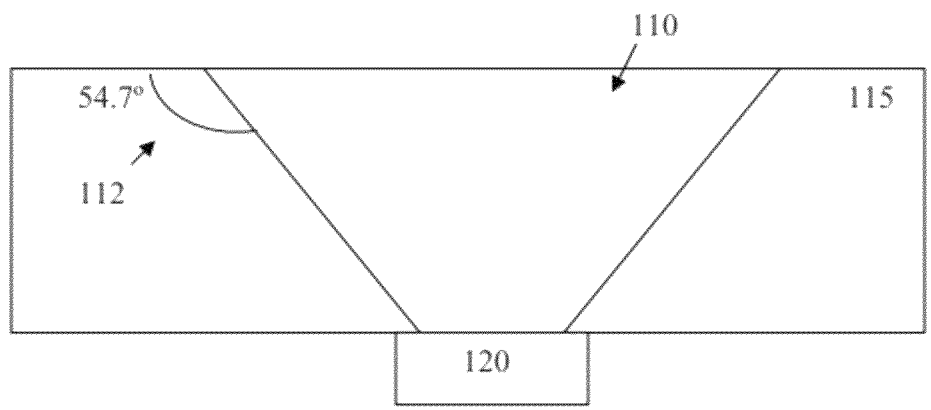
FIG. 1 is a cross-sectional diagram of a conventional horn of an acoustic device.

The acoustic horn 210 is formed by a horn etching process, performed on a back or bottom surface of the substrate 215, according to a representative embodiment, using the previously formed etch stop 221 as an etch stop barrier. As stated above, the horn etching process is performed by dry-etching the back surface of the substrate 215 in a controlled manner to generate a unique shape of the acoustic horn 210, e.g., other than the conventional square pyramid shape resulting from wet etching, as shown in FIG. 1, for example. Dry-etching processes include non-plasma and plasma based dry-etching. In plasma based dry-etching, radio frequency (RF) signals drive chemical reactions of gases to create plasma, e.g., at high temperatures. Types of plasma based dry-etching include physical and chemical etching, reactive ion etching (RIE) and deep reactive ion etching (DRIE).

One type of DRIE is referred to the Bosch® etching process, an example of which is described in U.S. Pat. No. 5,501,893, issued Mar. 26, 1996, the contents of which are hereby incorporated by reference. Generally, the Bosch® etching process uses high density plasma that cycles between a plasma-etching process and a teflon-coating process, which deposits an etch-resistant polymer (e.g., carbon) on side walls to prevent lateral etching. That is, the teflon-coating process periodically coats etch walls, exposed by the plasma-etching process, so that subsequent plasma-etching bores deeper without increasing the width of the etch.

The Bosch® etching process uses sulfur hexafluoride $SF_6$ for the plasma-etching process. However, according to various embodiments, other plasmas may be used to etch the backside of the substrate 215, such as fluorine plasma (e.g., $CF_4$ or $SF_6$), chlorine plasma (e.g., $Cl_2$), or mixed chlorine and fluorine plasma (e.g., $Cl_2+SF_6$). Also, a fluorine and carbon compound may be used, where the fluorine content is greater than carbon (e.g., $C_4F_8$). The shape of the acoustic horn 210 may then by customized by dynamically adjusting the ratio of elements in the compound, the time of exposure, pressure and/or the concentration of the compound. For example, as the portion of carbon is increased in a fluorine and carbon compound, the etch becomes less lateral. An example of the process for etching various horn shapes is discussed in detail with respect to FIG. 4, below.

As stated above, the Bosch® etching process alternates between etch and deposition cycles. For instance, the etching process may use a six second etch cycle with $SF_6$ gas, followed by a two second deposition cycle using $C_4F_8$ gas. These cycles are repeated to create a vertical etch with straight sidewalls, for example. By adjusting the relative pulse times of the etch and deposition cycles, the sidewall angle can be altered. For example, increasing the deposition cycle to four seconds while keeping the etch cycle at six seconds creates a closing profile (i.e., the diameter of the via narrows as the etch progresses).

Figure 3:
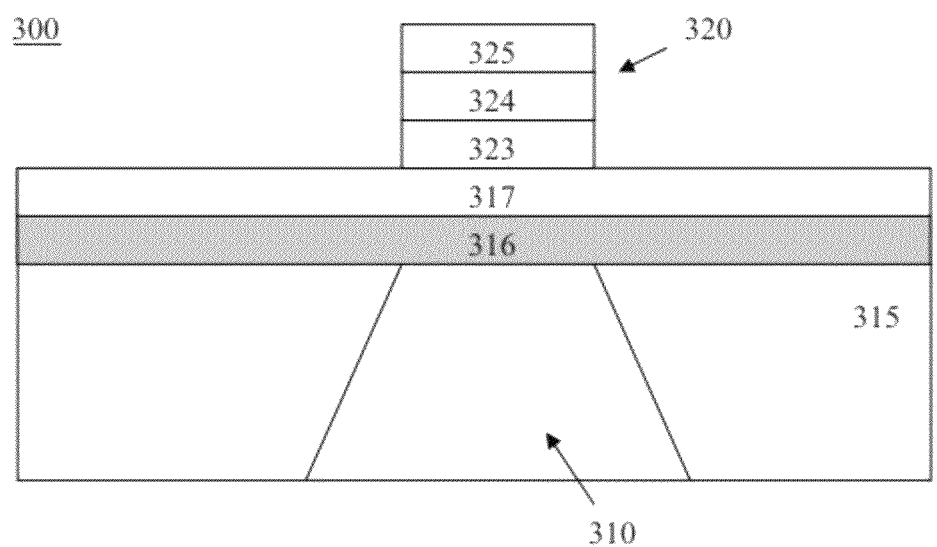
FIG. 3 is a cross-sectional diagram of an acoustic horn of an acoustic device, according to a representative embodiment.

FIG. 3 is a cross-sectional diagram of an acoustic horn for an acoustic device, according to another representative embodiment. As shown in FIG. 3, acoustic device 300 includes a micromachined acoustic horn 310 formed by a back side dry-etching process in a substrate 315, on which an acoustic transducer 320 has been formed. As discussed above, the acoustic transducer 320 is depicted as a piezoelectric thin film resonator, such as a PMUT device, although it may be any type of MEMS device.

According to an embodiment, the fabrication process begins with a silicon-on-insulator (SOI) wafer, for example, including a bulk substrate 315, a buried oxide layer 316 and a device layer 317. The bulk substrate 315 and the device layer 317 may be formed of silicon or GaAs, and the buried oxide layer 316 may be formed of silicon dioxide ($SiO_2$), for example. In the depicted embodiment, the buried oxide layer 316 serves as an etch stop with respect to the subsequent back side etching process to form the acoustic horn 310. In various embodiments, the device layer 317 may be part of the device 300, as shown, or it may be etched away.

The acoustic transducer 320 is then formed on the device layer 317 using any of a variety of layering techniques. For example, a first metal layer 323 (first electrode) is formed on the device layer 317, a piezoelectric material layer 324 is formed on the metal layer 323, and a second metal layer 325 (second electrode) is formed on the piezoelectric material layer 324. The first and second metal layers 323 and 325 may be formed of any metal compatible with semiconductor processes, such as molybdenum, tungsten or aluminum, for example. The piezoelectric material layer 324 may be formed of a material such as aluminum nitride, lead zirconate titanate (PZT), for example, or other film compatible with semiconductor processes. In various embodiments, the first metal layer 323, the piezoelectric material layer 324 and the second metal layer 325 are sequentially formed on the front surface of the device layer 317, and then etched using an etch mask to provide the transducer 320 of a desired size and shape, as shown in FIG. 3. However, other layering and shaping techniques may be incorporated without departing from the scope of the present teachings.

The acoustic horn 310 is formed by an etching process performed on a back or bottom surface of the bulk substrate 315, according to a representative embodiment, using the previously formed buried oxide layer 316 as an etch stop barrier. As stated above, the horn etching process is performed by dry-etching the back surface of the bulk substrate 315 in a controlled manner to generate a unique shape of the acoustic horn 310, e.g., other than the conventional square pyramid shape resulting from wet etching, as shown in FIG. 1, for example. The process of etching various horn shapes is discussed in detail with respect to FIG. 4, below.

According to various embodiments, the sizes and shapes of acoustic horns 210 and 310 may vary to provide unique benefits for any particular situation or to meet application specific design requirements of various implementations, as would be apparent to one skilled in the art. For example, FIG. 4 is a cross-sectional diagram of an acoustic horn for an acoustic device, according to a representative embodiment, in which the acoustic horn has a generally hyperbolic or exponential cross-sectional shape.

More particularly, acoustic horn 410 of acoustic device 400 includes a narrow throat 411 that is adjacent to a transducer device 420, such as a piezoelectric thin film resonator, and a wide or flared mouth 413. When the acoustic device 420 is a sound emitting acoustic transducer, for example, sound waves generated by the acoustic device 420 in response to an electric excitation signal enter the acoustic horn 410 at the throat 411 and exit as amplified sound waves from the mouth 413. Notably, the acoustic horn 410 is depicted facing upward from the acoustic device 420 for convenience of explanation. However, it is understood that the acoustic horn 410 may be back etched in the substrate 415 after formation of the transducer device 420 on a front surface of the substrate 415, as described above with respect to FIGS. 2 and 3.

Figure 4:
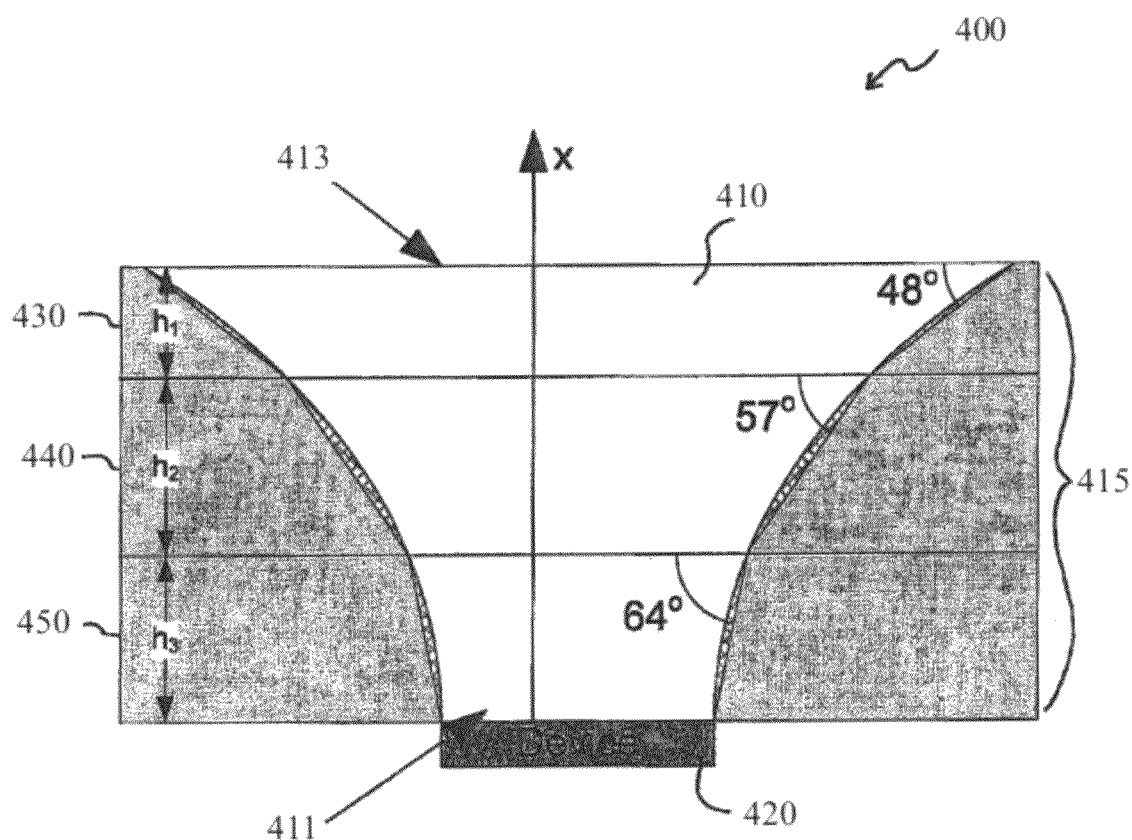
FIG. 4 is a cross-sectional diagram of an acoustic horn of an acoustic device, according to a representative embodiment.

As shown in FIG. 4, an exponential shape of the acoustic horn 410 can be approximated by a series of dry-etches, each with different conditions. An exponential horn has a varying cross-sectional area, A(x), given by Equation (1):

$$A(x) = A_0 e^{mx} \quad \text{Equation (1)}$$

Figure 6:
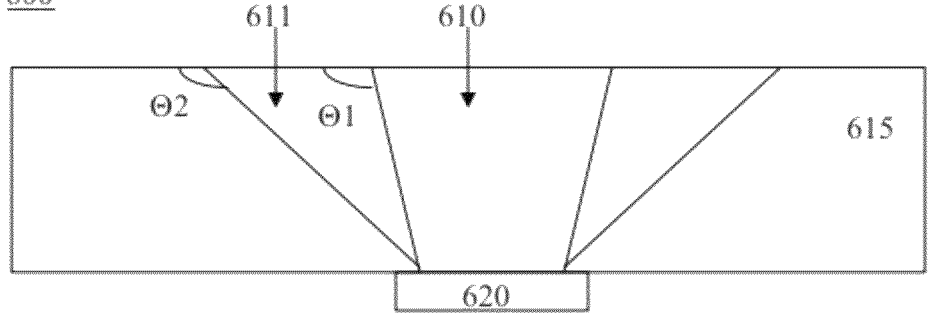
FIG. 6 is a cross-sectional diagram of an acoustic horn of an acoustic device, according to a representative embodiment.

In Equation (1), $A_0$ is the area of the throat 411, m is a flare constant, and x is the length of the horn (as measured perpendicularly from a plane containing the throat 411 to a plane containing the mouth 413). Compared to a conical horn (e.g., an example of which is shown in FIG. 6), an exponential horn has a flatter frequency response, above the cutoff frequency $f_c$. Also, the exponential acoustic horn 410 enables transmission of more sound, while reducing thickness requirements of the substrate 415. However, a conical horn may be constructed using a single dry-etch with a constant angle, where an exponential horn requires a multi-step dry-etch, as discussed below.

In order to determine the etching process, the parameters of the acoustic horn 410 are first determined. For example, the acoustic horn 410 may be designed for frequencies above 50 kHz. To provide suitable transmission, the flare constant m may be set to 1500, for example. The diameter of the throat 411 is determined by the diameter of the acoustic device 420, which is about 1.0 mm for a typical MEMS transducer. The substrate 415 may have a thickness of about 0.7 mm, for example. Therefore, applying Equation (1) to the illustrative parameters, the diameter of the throat 411 is 1.0 mm and the diameter of the mouth 413 is calculated to be 1.7 mm.

In the depicted embodiment, the acoustic horn 410 is etched in three consecutive stages to approximate an exponential shape. It is understood that additional etching stages may be performed, resulting in a horn shape that more nearly approximates a true exponential shape. In an embodiment, the etching stages may incorporate the Bosch® etching process, for example. The Bosch® etching process using alternating gas flows of a fluorine containing gas and a fluorocarbon, as discussed above. For example, the etching process may alternate between an $SF_6$ cycle for etching a silicon trench and a $C_4F_8$ cycle for periodically depositing polymer on the exposed sidewalls to prevent subsequent lateral etching. The parameters of the Bosch® etching process may be modified to create a variety of trench profiles, such as a closing profile or an opening profile (i.e., the diameter of the via widens as the etch progresses). A customized closing profile is created by modifying different etch parameters, such as increasing pressure, lowering bias power, lowering source power and/or lowering the $SF_6$ to $C_4F_8$ flow ratio. Similarly, a customized opening profile may be created by modifying these parameters in an opposite manner, such as decreasing pressure, increasing bias power, increasing source power and/or increasing the $SF_6$ to $C_4F_8$ flow ratio.

Figure 8A:
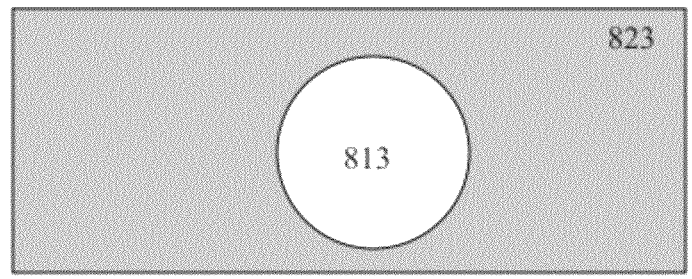
FIGS. 8A, 8B and 8C are cross-sectional diagrams of mouths of acoustic horns, according to representative embodiments.

Referring again to FIG. 4, to form the acoustic horn 410 having an approximate exponential shape, the dry-etching process starts at the mouth 413 with a set of initial closing profile conditions. The closing profile conditions are dynamically adjusted as the dry-etching proceeds through first, second and third sections 430, 440 and 450 of the substrate 415 toward the throat 411. For example, in the first substrate section 430, the ratio of $SF_6$ to $C_4F_8$ pulse times is relatively low, e.g., values between about 1.0 to about 2.0, and the bias power is set relatively low, e.g., at about 50 W. Accordingly, the dry-etching creates a first sidewall of the acoustic horn 410 (having a circular cross-section, for example, as shown in FIG. 8A) having an angle of about 48 degrees to a depth of approximately 0.1 mm. As the dry-etching progresses to the second section 440, the $SF_6/C_4F_8$ pulse ratio is increased, e.g., to values between about 2.0 to about 5.0, and the bias power is increased, e.g., to about 100 W. Accordingly, the dry-etching creates a second sidewall of the acoustic horn 410 (having the same relative cross-section) having an angle of about 57 degrees to an additional depth of approximately 0.3 mm. In the third section 450, the $SF_6/C_4F_8$ pulse ratio is again increased to exceed about 5.0, and the bias power is increased, e.g., to about 150 W, to create a near vertical profile. Accordingly, the dry-etching creates a third sidewall of the acoustic horn 410 (having the same relative cross-section) having an angle of about 64 degrees to an additional depth of approximately 0.3 mm.

It is understood that the ratios discussed above are only for illustrative purposes, and that different etch tools require different parameters. It is further understood that the number of substrate sections (e.g., first through third substrate sections 430, 440 and 450), as well as the thickness and angle of each substrate section, may vary to provide unique benefits for any particular situation or to meet application specific design requirements of various implementations, as would be apparent to one skilled in the art. For example, as discussed above, as the number of substrate sections increases, the overall shape of the acoustic horn 410 more nearly approximates a true exponential curve.

Figure 5:
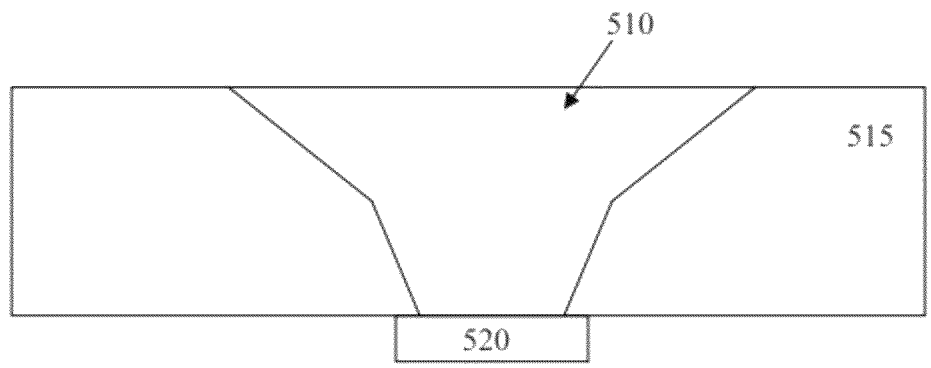
FIG. 5 is a cross-sectional diagram of an acoustic horn of an acoustic device, according to a representative embodiment.

FIGS. 5 and 6 are cross-sectional diagrams of acoustic horns having various non-limiting shapes, according to representative embodiments.

FIG. 5 shows acoustic device 500, which includes an acoustic horn 510 formed in substrate 515 for amplifying sound waves of acoustic transducer 510. The acoustic horn 510 is dry-etched to have a stepped profile with two distinct angles. A stepped profile provides advantages of a horn shape having small and large angles, without the added complexity and etching steps required to produce an exponential horn shape, as discussed above with respect to FIG. 4. For example, the acoustic horn 510 may be dry-etched using a closing profile with only two sets of sequentially applied closing profile parameters. In addition, the representative embodiment of FIG. 6 may be used to realize a "constant directivity" horn in a micromachined substrate. This class of acoustic horns maintains a directivity pattern over a wide range of frequencies.

FIG. 6 shows acoustic device 600, which includes an acoustic horn 610 or 620 formed in a substrate 615 for amplifying sound waves of the acoustic transducer 610. The acoustic horn 610 or 620 is dry-etched to have a conical profile at any single angle. When the cross-section of the mouth on the outside surface of the substrate 615 is circular (e.g., as shown in FIG. 8A), the shape of the acoustic horns 610 and 611 is conical.

The representative acoustic horn 610 has sidewalls formed at a first angle $\theta_1$ with a surface of the substrate 615, while the representative acoustic horn 611 has sidewalls formed at a second angle $\theta_2$ with the surface of the substrate 615. The first angle $\theta_1$ is smaller than the second angle $\theta_2$, indicating that the sidewalls of the acoustic horn 610 are more vertical than the sidewalls of the acoustic horn 611. The small first angle $\theta_1$ improves sound transmission through the acoustic horn 610 in a relatively narrow direction, thus increasing the magnitude of the radiated sound, which is especially helpful for low frequencies. In comparison, the larger second angle $\theta_2$ has a lower magnitude of radiated sound, and thus is used to achieve a desired mouth diameter of the acoustic horn 611 in a thinner substrate 615. As described above, In order to produce the larger second angle $\theta_2$, the dry-etching process requires a lower $SF_6/C_4F_8$ pulse ratio, a lower bias power, a lower source power and/or a lower application pressure than the dry-etching process used to produce the first angle $\theta_1$.

Notably, the acoustic horns 510 and 610/611 are depicted facing upward from the acoustic device 520 and 620, respectively, for convenience of explanation. However, it is understood that the acoustic horns 510 and 610/611 may be back etched in the substrates 515 and 615, respectively, as described above with respected to FIGS. 2 and 3.

Figure 7:
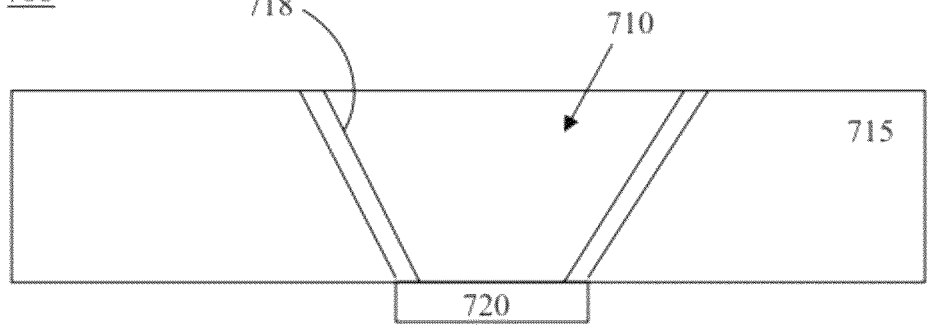
FIG. 7 is a cross-sectional diagram of an acoustic horn of an acoustic device having a thin film coating, according to a representative embodiment.

FIG. 7 is a cross-sectional diagram of an acoustic horn of an acoustic device having a thin film coating, according to a representative embodiment.

FIG. 7 shows acoustic device 700, which includes a micromachined acoustic horn 710 formed in a substrate 715 for amplifying sound waves of the acoustic transducer 710. For any horn geometry discussed herein, including the acoustic horn 720, a thin film coating 718 may be applied to improve sound transmission and/or environmental robustness. For example, following completion of the dry-etching process, the substrate 715 within the acoustic horn 720 may be coated with a thin film coating 718 formed of very hard material, such as diamond, to reduce sound absorption by the substrate 715. In another representative embodiment, the exposed substrate 715 within the acoustic horn 720 may be coated with a thin film coating 718 formed of hydrophobic material, such as silicon nitride, to reduce the collection of water droplets on the substrate sidewalls of the acoustic horn 720. This is particularly useful in a high-humidity environment, for example. In addition, in another representative embodiment, the thin film coating 718 may be formed of an anti-corrosive material, such as silicon carbide, to provide resistance to corrosive environments.

Figure 8B:
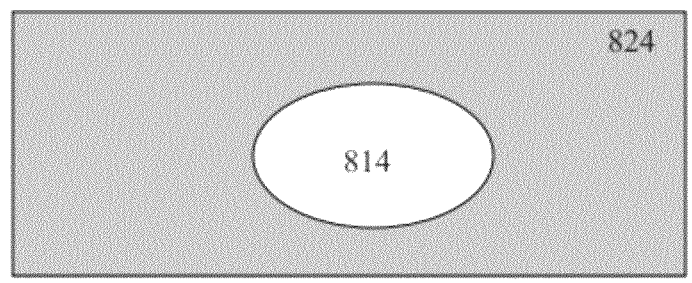
Figure 8C:
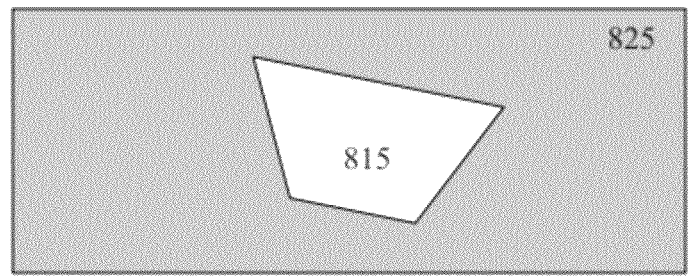

FIGS. 8A, 8B and 8C are cross-sectional diagrams of mouths of acoustic horns, according to representative embodiments, indicating examples of the various shaped horn mouths and/or corresponding horn throats (not shown).

FIG. 8A depicts a circular cross-section of a micromachined horn mouth 813, exposed at an outer surface of a substrate 823, which may be generated pursuant to the dry-etching process depicted in FIGS. 4-7. For example, an acoustic horn 410 having generally exponential sidewalls may have a circular mouth 413 and an acoustic horn 510 having stepped sidewalls, may have circular mouths, as shown by micromachined horn mouth 813. Likewise, a generally conical acoustic horn, such as acoustic horns 610 and 611 of FIG. 6, may have circular mouths. FIG. 8B depicts an elliptical cross-section of a micromachined horn mouth 814, exposed at an outer surface of the substrate 824, which may be generated pursuant to the dry-etching process depicted in FIGS. 4-5.

FIG. 8C depicts a representative irregularly shaped cross-section of a micromachined horn mouth 815, exposed at an outer surface of a substrate 825. The micromachined horn mouth 815 depicts one example of innumerable possible irregularly shaped cross-sections, indicating the versatility of dry-etching process for acoustic horns. The irregular shaped horn mouth 815 may be included in an acoustic horn have irregular sidewalls.

Figure 9:
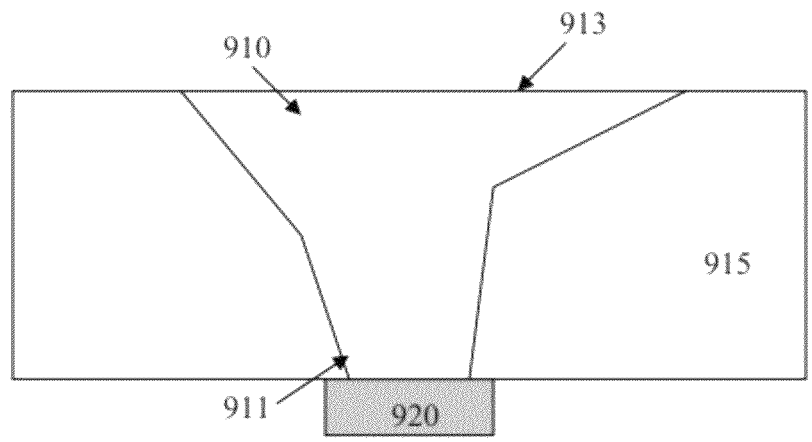
FIG. 9 is a cross-sectional diagram of an acoustic horn of an acoustic device, according to a representative embodiment.

For example, referring to FIG. 9, representative acoustic horn 910 of acoustic device 900, formed in a substrate 915 for amplifying sound waves of the acoustic transducer 910, has skewed sidewalls. Accordingly, the acoustic horn 910 may have an irregularly shaped mouth 913 and/or throat 911, similar to the micromachined horn mouth 830 of FIG. 8C, for example.

In order to achieve the irregular cross-section of the acoustic horn 910, for example, a modified dry etch and mask process is used. Another illustrative method of creating sloped sidewall etches (other than modified Bosch® etching processes, as discussed above, for example) is to make use of resist erosion during the etch. By introducing $O_2$ into the etch plasma, the sidewall of the resist is consumed during the etch and erodes to create a larger opening. As the etch progresses and the resist erosion becomes more pronounced, the top of the via (nearest to the resist) becomes progressively larger to create a closing profile. In order to skew the sidewalls, such that the angle of the two opposite sides of the via are different (e.g., as shown in FIG. 8C and/or FIG. 9), a hard mask may be placed on one side of the via opening. For instance, a material that is non-etchable in the plasma chemistry could be placed on one side of the via opening instead of resist. In the case of $SF_6$ chemistry, the material may include Au or AlN, for example, which are referred to as a hard mask. The hard mask would not be attacked by the etch plasma and thus would not erode. The net effect would be a near vertical sidewall under the hard mask and a sloped sidewall on the side with the resist. The sidewall angle under the resist may be controlled by varying the etch parameters. For example, more $O_2$ and higher source powers cause more erosion and more sloped sidewalls.

The dry-etching process may be incorporated into formation of various types of MEMS acoustic devices, including for example a microcap acoustic transducer device, described in U.S. patent application Ser. No. 12/430,966 to Philliber et al., filed Apr. 28, 2009, the contents of which are hereby incorporated by reference.

Figure 10:
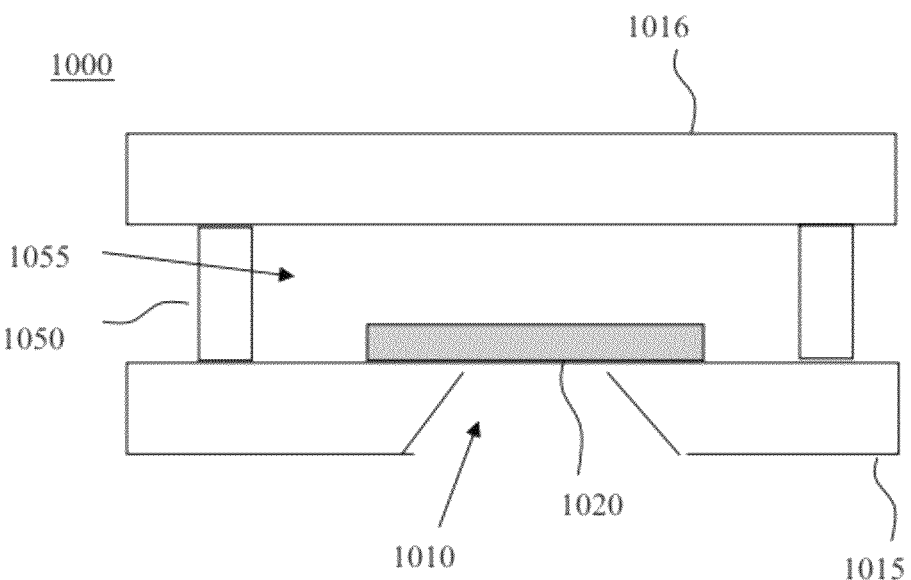
FIG. 10 is a cross-sectional diagram of an acoustic horn of an acoustic device, according to a representative embodiment.

For example, FIG. 10 shows a representative microcap acoustic device 1000, which includes acoustic transducer 1020 formed on a front surface of lower wafer or substrate 1015, such that the acoustic transducer 1020 is contained within cavity 1055 formed by lower substrate 1015 (e.g., "base wafer"), upper wafer or substrate 1016 (e.g., "cap wafer") and gasket 1050. An acoustic horn 1010 is dry-etched in the back or bottom surface of the lower substrate 1015, according to the various representative embodiments described herein (before or after formation of the cavity 1055). In the depicted embodiment, the acoustic horn 1010 has a conical profile, although it is understood that the acoustic horn 1010 may have any profile according to the flexible dry-etching process described herein.

Generally, in various embodiments, the lower substrate 1015 and/or upper substrate 1016 are semiconductor wafers, such as silicon or GaAs, or transparent substrates, such as glass. Beneficially, however, the lower and upper substrates 1015 and 1016 are made of the same material to avoid thermal expansion mismatch problems. The gasket 1050 bonds the lower and upper substrates 1015 and 1016 to define the cavity 1055. The gasket 1050 may be fabricated directly onto one of bonded lower and upper substrates 1015 and 1016, or can be applied during the bonding process. The gasket 1050 may be made of silicon applied to one of the lower or and upper substrates 1015 and 1016, although other material may be used, including polymers (BCB, Polyimide, etc.) or various metals or metallic alloys (Au, Cu, Au—Hg alloy, etc.), for example.

In an embodiment, the gasket 1050 hermetically seals the cavity 1055 between the lower and upper substrates 1015 and 1016. In another embodiment, the gasket 1050 may have a structure which permits air flow to pass between the exterior of the acoustic device 1000 and the cavity 1055, which at the same time inhibits or prevents contaminates from entering the cavity 1055 and coming in contact with the acoustic transducer 1020.

Accordingly, by adjusting parameters during a dry-etching process of a semiconductor substrate (e.g., silicon wafer), the shapes and angles of acoustic horn sidewalls are altered to obtain any variety of horn shapes. For example, an acoustic horn shape may be created by starting with a wide feature opening in the mask and using a closing profile to generate the outermost portion of the horn. As the etch progresses through the semiconductor substrate, the parameters may be adjusted to create a more vertical profile, such that the etch is vertical by the time it reaches the position of the acoustic device (e.g., transducer) on the opposite side of the semiconductor substrate. The dry-etching process may be refined by any number of steps (2-∞) to create a smooth sidewall.

The various components, materials, structures and parameters are included by way of illustration and example only and not in any limiting sense. In view of this disclosure, those skilled in the art can implement the present teachings in determining their own applications and needed components, materials, structures and equipment to implement these applications, while remaining within the scope of the appended claims.

The invention claimed is:

1. An acoustic device, comprising:
a transducer formed on a first surface of a substrate; and
an acoustic horn formed in the substrate by a dry-etching process through an opposing second surface of the substrate, and positioned to amplify sound waves from the transducer, the acoustic horn defining a non-linear, asymmetrical cross-sectional profile.

2. The acoustic device of claim 1, wherein the cross-sectional profile comprises substantially exponential sidewalls.

3. The acoustic device of claim 1, wherein the cross-sectional profile comprises stepped sidewalls.

4. The acoustic device of claim 1, wherein the acoustic horn defines a mouth having a shape other than a square shape.

5. The acoustic device of claim 1, wherein the shape of the mouth comprises one of a circle or an oval.

6. The acoustic device of claim 1, wherein the transducer comprises a piezoelectric MEMS ultrasonic transducer (PMUT).

7. The acoustic device of claim 1, wherein the transducer comprises a piezoelectric thin film between two metal layers.

8. The acoustic device of claim 1, further comprising:
a thin film coated on interior walls of the acoustic horn.

9. The acoustic device of claim 8, wherein the thin film comprises diamond for reducing sound absorption of the substrate within the acoustic horn.

10. The acoustic device of claim 8, wherein the thin film comprises one of silicon nitride and silicon carbide.

11. An acoustic device, comprising:
a semiconductor substrate;
a piezoelectric ultrasonic transducer formed on a front surface of the substrate; and
an acoustic horn formed through a back surface of the substrate by a multi-step dryetching process, a throat of the acoustic horn being positioned adjacent to the transducer, wherein a cross-sectional profile of the acoustic horn comprises substantially exponential sidewalls.

12. The acoustic device of claim 11, wherein the ultrasonic transducer comprises a piezoelectric MEMS ultrasonic transducer (PMUT).

13. The acoustic device of claim 11, wherein the ultrasonic transducer comprises a piezoelectric thin film between two metal layers.

14. The acoustic device of claim 11, further comprising: a thin film coated on interior walls of the acoustic horn.

15. The acoustic device of claim 14, wherein the thin film comprises diamond for reducing sound absorption of the substrate within the acoustic horn.

16. The acoustic device of claim 14, wherein the thin film comprises one of silicon nitride and silicon carbide.

17. An acoustic device comprising:
a semiconductor substrate;

a piezoelectric ultrasonic transducer formed on a front surface of the substrate; and an acoustic horn formed through a back surface of the substrate by a dry-etching process, a throat of the acoustic horn being positioned adjacent to the transducer, wherein a cross-sectional profile of the acoustic horn comprises stepped sidewalls with at least two distinct angles, wherein the stepped sidewalls of the acoustic horn are skewed with respect to one another, such that corresponding angles of opposite sides of the stepped sidewalls are different.

18. The acoustic device of claim 17, further comprising:

a thin film coated on the stepped sidewalls of the acoustic horn, the thin film comprising one of diamond, silicon nitride and silicon carbide.

* * * * *